(12) United States Patent
Marchione et al.

(10) Patent No.: US 10,352,448 B2
(45) Date of Patent: Jul. 16, 2019

(54) METHOD OF MANUFACTURING A SEAL

(71) Applicant: Caterpillar Inc., Peoria, IL (US)

(72) Inventors: Thierry Marchione, Heber City, UT (US); Timothy A. Thorson, Morton, IL (US); Dennis Michael Turczyn, Edelstein, IL (US)

(73) Assignee: Caterpillar Inc., Deerfield, IL (US)

( * ) Notice: Subject to any disclaimer, the term of this patent is extended or adjusted under 35 U.S.C. 154(b) by 8 days.

(21) Appl. No.: 15/665,963

(22) Filed: Aug. 1, 2017

(65) Prior Publication Data
US 2019/0040955 A1    Feb. 7, 2019

(51) Int. Cl.
| | |
|---|---|
| F16J 15/00 | (2006.01) |
| F16J 15/16 | (2006.01) |
| C23C 14/24 | (2006.01) |
| C22C 37/00 | (2006.01) |
| B22D 23/00 | (2006.01) |
| C22C 19/00 | (2006.01) |
| C22C 38/00 | (2006.01) |
| F16C 33/00 | (2006.01) |

(52) U.S. Cl.
CPC .......... *F16J 15/162* (2013.01); *B22D 23/00* (2013.01); *C22C 19/00* (2013.01); *C22C 37/00* (2013.01); *C22C 38/00* (2013.01); *C23C 14/24* (2013.01); *F16C 33/00* (2013.01)

(58) Field of Classification Search
CPC .......... F16C 33/00; C16J 15/00; B23K 26/00; B22D 23/00; C22C 19/00; C22C 37/00; C22C 38/00; F16J 15/00
See application file for complete search history.

(56) References Cited

U.S. PATENT DOCUMENTS

| | | | |
|---|---|---|---|
| 5,700,546 A | 12/1997 | Fujii et al. | |
| 2007/0228664 A1* | 10/2007 | Anand | F16J 15/3412 277/399 |
| 2016/0369896 A1 | 12/2016 | Thorson et al. | |

FOREIGN PATENT DOCUMENTS

CN        205559794        9/2016

OTHER PUBLICATIONS

"Laser gas nitriding of pure titanium using CW and pulsed Nd:YAG lasers", Edson Costa Santos, Masanori Morita, Masanori Shiomi, Kozo Osakada, Masataka Takahashi, Surface & Coatings Technology 201 (2006) 1635-1642. (Year: 2006).*

"Laser Surface Nitriding of Ti—6Al—4V for Bio-implant Application",Trends Biomater.Artif Organs, vol. 20(1), pp. 68-71 (2006), http://www.sbaoi.org.

* cited by examiner

*Primary Examiner* — Gordon Baldwin
*Assistant Examiner* — Mohammad Mayy

(57) ABSTRACT

A method for manufacturing a seal is disclosed. The method includes forming a layer of a hardened metal layer on a metal base plate. Further, the method includes melting the layer of the hardened metal in a nitrogen atmosphere to form a layer of metal nitride. Furthermore, the method includes depositing a plurality of layers of a metal alloy on the layer of metal nitride to form a main seal body portion, wherein the layer of metal nitride and the main seal body portion together correspond to the seal.

11 Claims, 5 Drawing Sheets

//+ # METHOD OF MANUFACTURING A SEAL

TECHNICAL FIELD

The present disclosure relates to seals. More particularly, the present disclosure relates to a method of manufacturing a seal.

BACKGROUND

Seals, such as mechanical face seals, may be employed in a variety of systems, environments, and/or applications. For example, mechanical face seals may be formed, at least in part, of a metal, or other rigid material, and may be incorporated and utilized to sealingly engage another component, which may be a mechanical system component and/or another seal, and, in so doing, may retain lubricants within the system and/or may prevent external debris or foreign matter from being introduced within the internal, sealed environment of the interior of the system. However, under certain conditions which may be attendant to the operation and/or environment of the system, and/or the interaction between the components thereof, interaction between one or more components of the system may lead to wearing of the seal. The wearing of the seal may be caused due to numerous reasons such as, but not limited to, frictional forces which the seal may experience, such as, at the sealing interface. Repeated exposure to frictional forces and/or one or more instances of exposure to a frictional force which may be excessive may result in damage to the seal which may compromise the effectiveness of the seal to retain lubricants within the system and/or may prevent external debris or foreign matter from being introduced within the internal, sealed environment of the interior of the system, which may, in turn, compromise the operation of the system.

U.S. Pat. No. 5,700,546 relates to a seal that comprises a combination of a movable member and a stationary member. Either one of the movable and stationary members is irradiated with an ion beam consisting essentially of nitrogen ions and at the same time as titanium is vacuum-deposited on the surface of either the movable member or the stationary member, thereby forming a thin titanium nitride film.

SUMMARY

Various aspects of the present disclosure disclose method for manufacturing a seal. The method includes forming a layer of a hardened metal layer on a metal base plate. Further, the method includes melting the layer of the hardened metal layer in a nitrogen atmosphere to form a layer of metal nitride. Furthermore, the method includes depositing a plurality of layers of a metal alloy on the layer of metal nitride to form a main seal body portion, wherein the layer of metal nitride and the main seal body portion together correspond to the seal.

Various aspects of the present disclosure disclose a seal. The seal includes a main seal body portion having an outer circumferential surface and an inner circumferential surface, the main seal body portion being formed of a titanium alloy. Further, the seal includes an outer seal layer formed of a layer of titanium nitride, wherein the outer seal layer and the main seal body portion forms the seal having an outer axial end and a sealing end, wherein the main seal body portion extends from the outer axial end to the outer seal layer, and wherein the outer seal layer extends from the main seal body portion to the seal. Furthermore, the seal includes one or more channels defined in the main seal body portion, each of the one or more channels having an opening defined on the inner circumference of the main seal body portion.

Various aspects of the present disclosure disclose a seal formed by a process comprising forming a layer of a hardened titanium layer on a metal base plate. The layer of the hardened titanium layer is heated in a nitrogen atmosphere to form a layer of titanium nitride. Thereafter, a plurality of layers of a titanium alloy is deposited on the layer of titanium nitride to form a main seal body portion, wherein the layer of titanium nitride and the main seal body portion together correspond to the seal.

DETAILED DESCRIPTION

Figure 1:
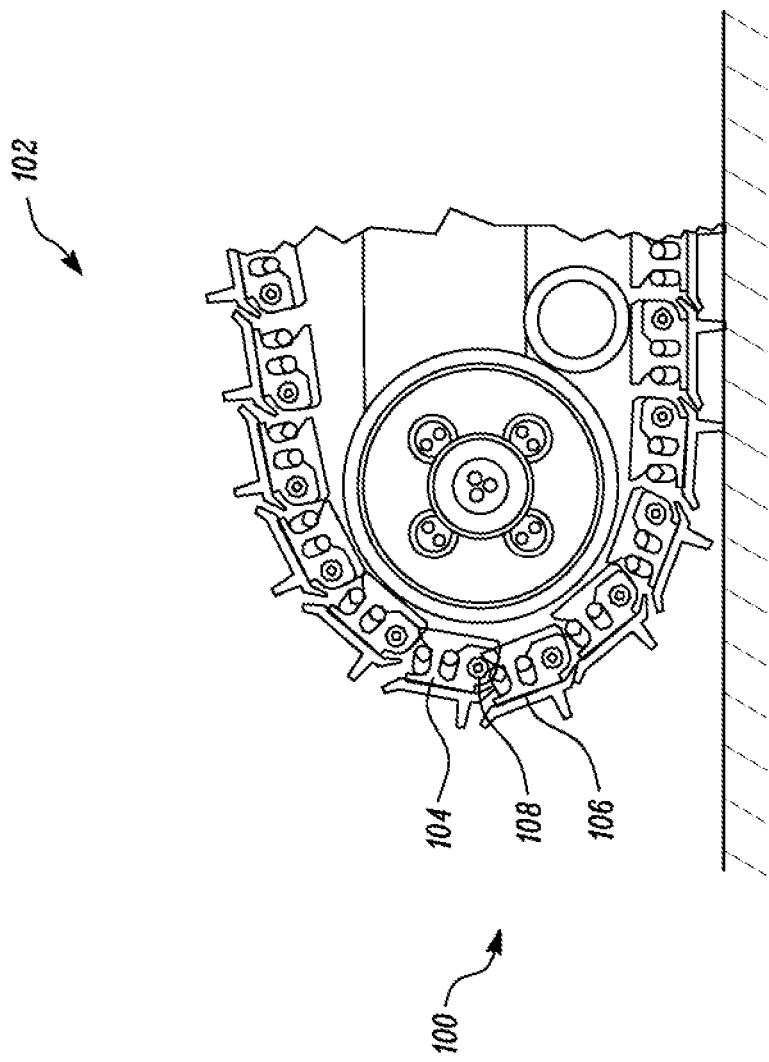
FIG. 1 is a diagrammatic illustration of a portion of an endless track, in accordance with the concepts of the present disclosure.

Referring to FIG. 1, a portion of an endless track 102 is illustrated. The endless track 102 may be functionally implemented as a traction device of a machine (not shown) that may be rotatably engaged by a drive or power system of a machine (not shown) to effectuate one or more of the movement, turning, positioning, and travel of the machine. The machine may be embodied as an excavator, a dozer, a dragline, a tracked hydraulic mining shovel, a tracked loader, a tractor, or any other machine which may include or may be configured to utilize an endless track 102 for movement, traction, and motion thereof. As shown in FIG. 1, and as further illustrated in FIG. 2, the endless track 102 includes a plurality of pairs of track links 104, 106 aligned in parallel spaced relation, which are joined at each end to a subsequent and preceding pair of track links by joint assemblies (as further disclosed herein as joint assembly 108) to form the endless track 102. In particular, the endless track 102 can be formed by and/or can include a plurality of track link assemblies 100, wherein each track link assembly 100 includes a first pair of links 104 and a second pair of links 106, which are coupled with each other through the joint assembly 108.

Figure 2:
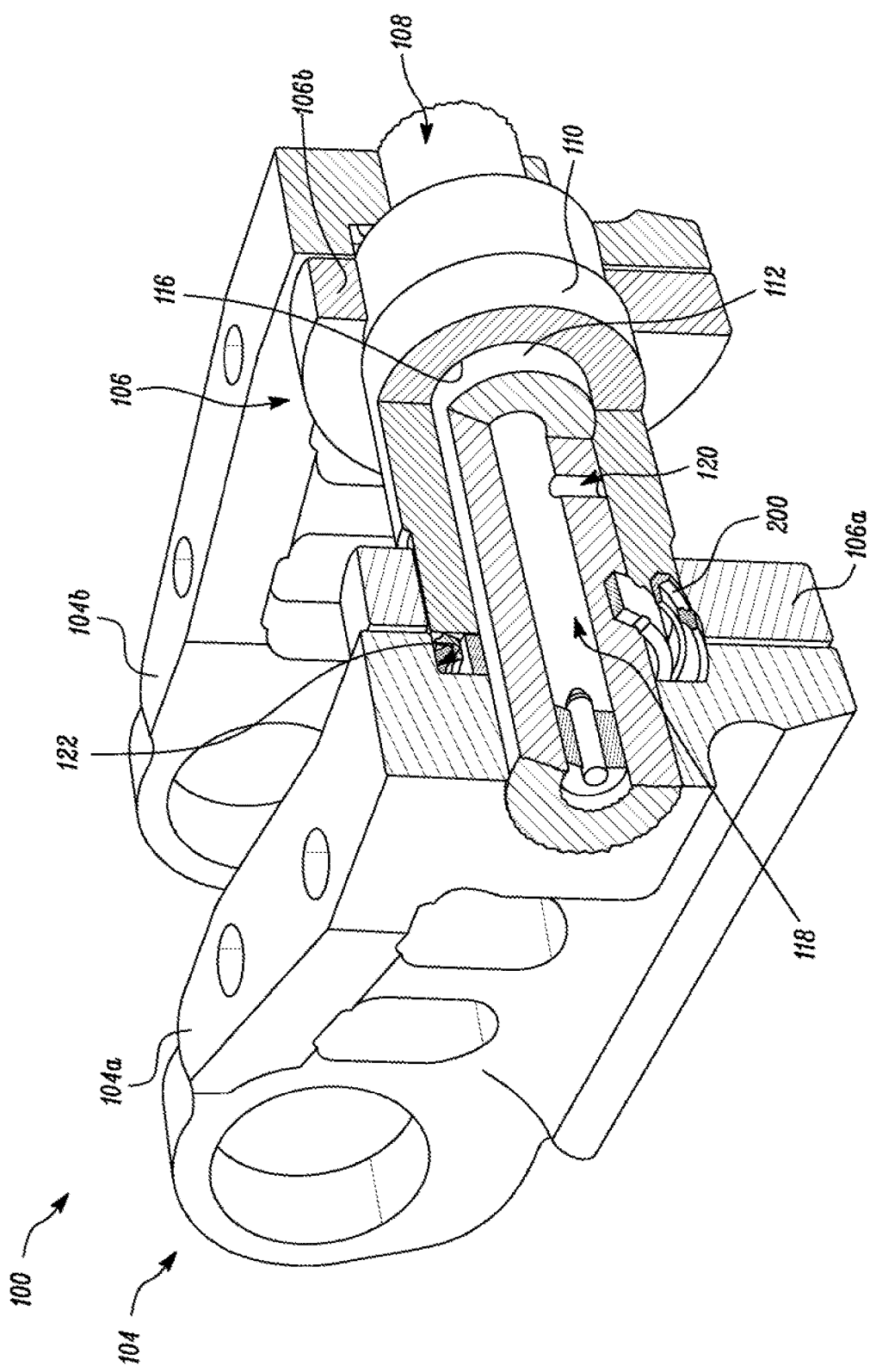
FIG. 2 is a sectional view of a joint between two pair of links in the endless track, in accordance with the concepts of the present disclosure.

FIG. 2 illustrates an exemplary, non-limiting embodiment of a mechanical system into which seal 200 (200a, 200b) according to any one or more embodiments of the present disclosure may be implemented or otherwise used to form and maintain an outer sealing interface. In particular, FIG. 2 illustrates an exemplary, non-limiting embodiment of a mechanical system embodied as the track link assembly 100 which may be used, in part, to form the endless track 102 as illustrated in FIG. 1. The track link assembly 100 includes the first pair of track links 104, which includes a first track link 104a and a second track link 104b (which may be substantially identical to first track link 104a) aligned in parallel spaced relation with first track link 104a, and the second pair of track links 106, which includes a first track link 106a and a second track link 106b (which may be substantially identical to first track link 106a) aligned in parallel spaced relation with 106a, as well as a joint assembly 108 which pivotally and mechanically couples the first pair of track links 104 to the second pair of track links 106. The joint assembly 108 includes a bushing 110, a pin 112, and the seal 200.

The pin 112 includes a chamber 118 and an opening 120. The opening 120 fluidly couples the chamber 118 with a surface of a bore 116 (defined on the bushing 110). In an embodiment, the chamber 118 is configured to store a lubricant fluid. The lubricant fluid provides a lubrication for the relative movement between the pin 112 and the bushing 110. Examples of the lubricant fluid may include, but are not limited to, Paraffinic, Naphthenic, Aromatic9, grease, and the like.

In an embodiment, an annular space 122 may exist between the bushing 110 and the first pair of links 104. Under certain conditions, the lubricant fluid may leak out of the annular space 122. In order to avoid the leakage of the lubricant fluid, the seal 200 is positioned in the annular space 122, and, as further discussed herein, can be positioned therein and configured to engage, and maintain a sealing interface or engagement with an adjacent, facing component or surface thereof which the seal face surface 208a, 208b (and the outer seal band 230a, 230b thereof) of the outer seal layer 206a, 206b contacts, which, in the exemplary embodiment as shown in FIG. 2, may be an outer, lateral surface of the bushing 110. In an embodiment, the seal 200 may correspond to a metal seal or a rigid seal. The structure of the seal 200 has been described in conjunction with FIG. 3 and FIG. 4.

Figure 3:
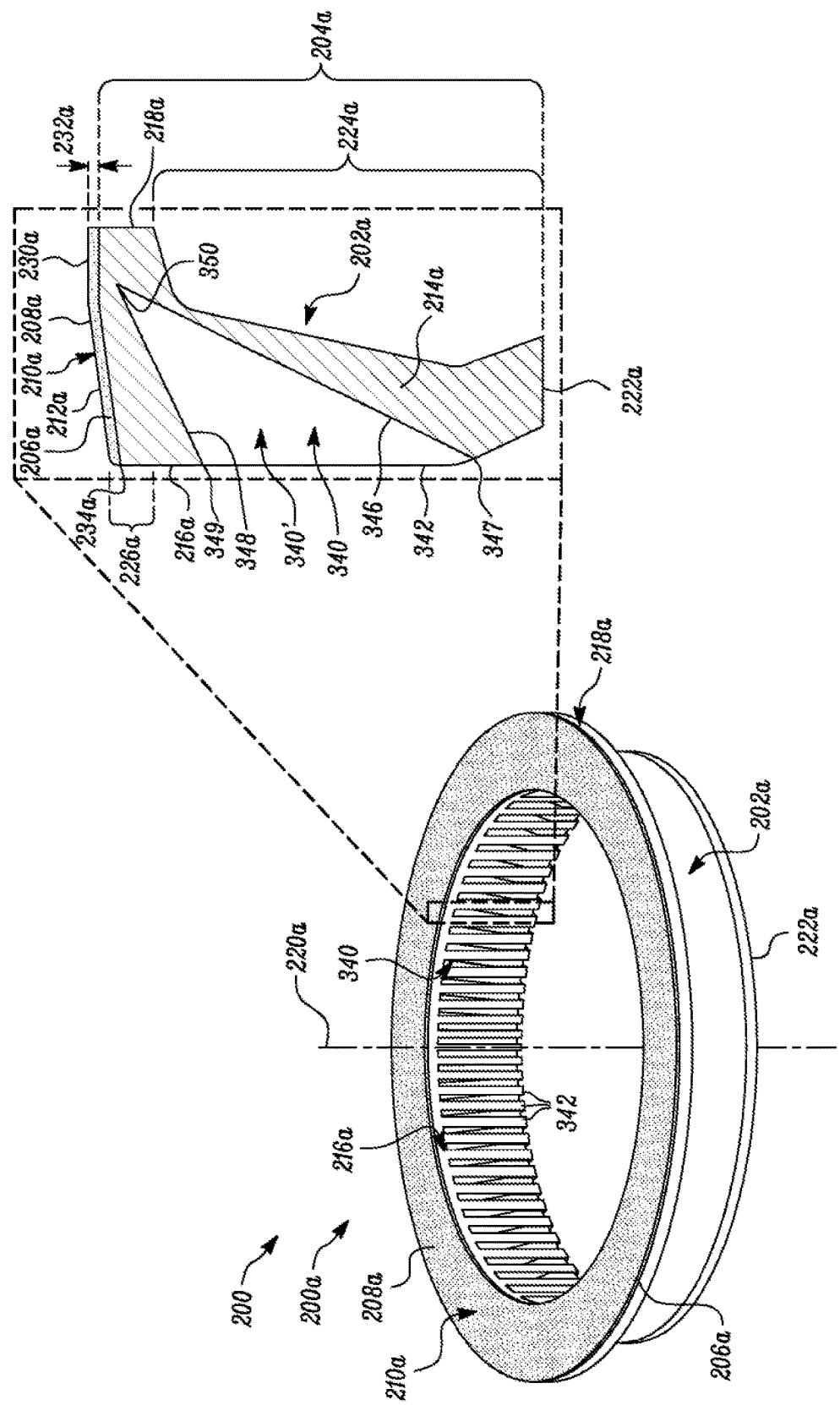
FIG. 3 illustrates a perspective view and a sectional view of a seal, in accordance with the concepts of the present disclosure.
Figure 4:
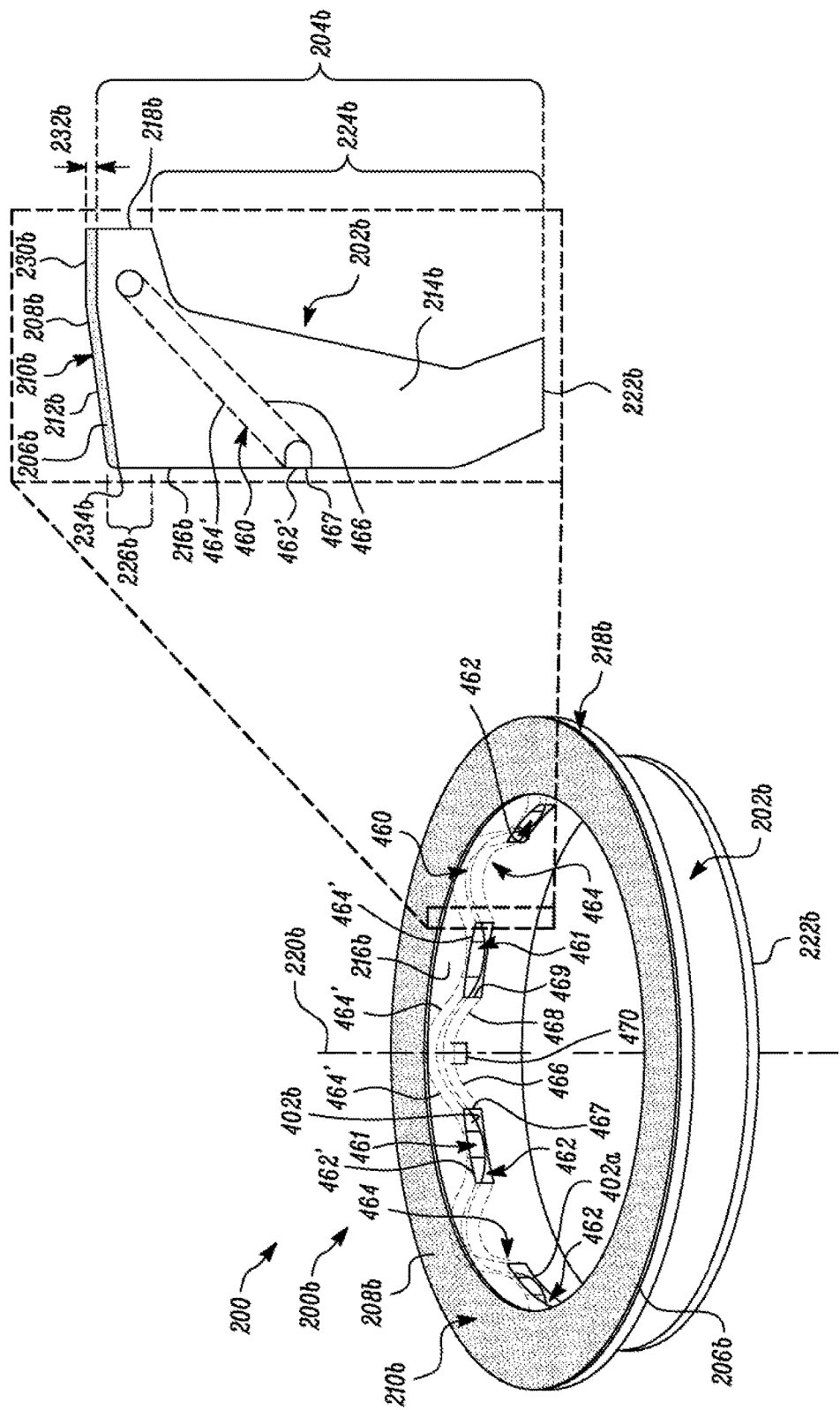
FIG. 4 illustrates another perspective view of the seal, in accordance with the concepts of the present disclosure.

FIG. 3 illustrates an embodiment of seal 200, wherein seal 200 is embodied as seal 200a, and FIG. 4 illustrates another embodiment of seal 200, wherein seal 200 is embodied as seal 200b. With the exception of the channels 340 of seal 200 embodied as seal 200a as shown in the embodiment as illustrated in FIG. 3 and the channel 460 of seal 200 embodied as seal 200b as shown in the embodiment as illustrated in FIG. 4 and further discussed herein, seal 200a may be identical to, or may be substantially identical to seal 200b. As such, unless otherwise noted, elements, features, and other characteristics as discussed herein which common to and shared by both of seal 200 embodied as seal 200a as well as seal 200 embodied as seal 200b will include corresponding reference numbers (except that reference characters "a" and "b" will be used to identify or designate seal 200a of FIG. 3 and seal 200b of FIG. 4, respectively) and will be discussed with reference to both of FIG. 3 and FIG. 4.

Referring to FIG. 3 and FIG. 4, seal 200 (200a, 200b) can be annular or ring shaped, and may be a rigid, face-type seal, such as a Heavy Duty Dual Face seal. Additionally, or alternatively, seal 200 (200a, 200b), may be embodied as Duo-Cone™ seal, as produced by Caterpillar Inc., or other similar type seal. The seal 200 (200a, 200b) can be defined as and/or fabricated as an integrally formed, solid, unitary, and annular seal body 202a, 202b. In particular, the seal 200 (200a, 200b), and the seal body 202a, 202b thereof, is formed to include a main seal body portion 204a, 204b and the outer seal layer 206a, 206b, which define and/or compose the integrally formed, solid, unitary, and annular seal body 202a, 202b. The outer seal layer 206a, 206b of the annular seal body 202a, 202b includes and defines the seal face surface 208a, 200b, which can include the outer seal band 230a, 230b, as further discussed herein, at a sealing end 210a, 210b of the seal 200 (200a, 200b) and the annular seal body 202a, 202b thereof. The seal face surface 208a, 208b of the outer seal layer 206a, 206b, and the outer seal band 230a, 230b thereof, is configured to interact with, engage, and maintain a sealing interface or engagement with an adjacent, facing component or surface thereof which the seal face surface 208a, 208b (and the outer seal band 230a, 230b thereof) of the outer seal layer 206a, 206b contacts. As further discussed herein, the seal 200 (200a, 200b) can be fabricated such that the outer seal layer 206a, 206b (and seal face surface 208a, 208b) is composed of a first material 212a, 212b and the main seal body portion 204a, 204b is composed of a second or main seal body material 214a, 214b.

The seal 200 (200a, 200b), and the annular seal body 202a, 202b thereof, can include an inner circumference 216a, 216b and an outer circumference 218a, 218b defined around a center axis 220a, 220b of the seal 200 (200a, 200b). The seal 200 (200a, 200b), and seal body 202a, 202b) thereof, can extend axially about the center axis 220a, 220b from a first outer axial end 222a, 222b to a second outer axial end, defined as the sealing end 210a, 210b of the seal 200 (200a, 200b). The annular seal body 202a, 202b can be defined as a solid, unitary body which includes a first section 224a, 224b and a second section 226a, 226b. In one embodiment, as shown in FIG. 3 and FIG. 4, the first section 224a, 224b can extend axially from the first outer axial end 222a, 222b of the seal body 202a, 202b to the second section 226a, 226b, wherein one or more inner surfaces of the first section 224a, 224b can define, at least in part, the inner circumference 216a, 216b of the seal 200 (200a, 200b). The second section 226a, 226b can extend laterally or radially outward from the axially-extending first section 224a, 224b and the center axis 220a, 220b to the outer, radially-extending seal face surface 208a, 208b which defines the second outer axial end or sealing end 210a, 210b) of the formed seal 200 (200a, 200b. The second section 226a, 226b can also extend radially outward from the first section 224a, 224b and/or the inner circumference 216a, 216b of the seal body 202a, 202b to define, in part, the outer circumference 218a, 218b of the seal 200 (200a, 200b), or at least the outermost portion or extension thereof.

In one embodiment, the first section 224a, 224b, or at least the one or more inner surfaces thereof which may partially form the inner circumference 216a, 216b of the seal body 202a, 202b may be substantially axially aligned with the center axis 220a, 220b as it extends from the first outer axial end 222a, 221b to the second section 226a, 226b. The meaning of the term. "substantially" as within, as well as the phrase "substantially axially aligned with the center axis 220a, 220b" as disclosed within an embodiment as within, as well as, the phrase "substantially axially along and with respect to the center axis 220a, 220b" means that one or more of the first section 224a, 224b and the one or more inner surfaces first section 224a, 224b which may partially form the inner circumference 216a, 216b of the seal body 202a, 202b are oriented at an angle within a range of between 0° (i.e., parallel) to +/−40° with respect to the center axis 220a, 220b. Furthermore, or in an additional embodiment, the second section 226a, 226b may extend laterally or radially outward from the axially-extending first section 224a, 224b and the center axis 220a, 220b such that an outer cross-sectional profile of the seal 200 (200a, 200b), and the seal body 202a, 202b thereof, may include a substantially "L-shaped" outer cross-sectional profile. For the purposes of applicable embodiments of the present disclosure, the "substantially 'L' shaped outer cross-sectional profile" of the seal body 202a, 202b as defined by (and between) the first section 224a, 224b and the second section 226a, 226b means that the second section 226a, 226b extends radially outward from the center axis 220a, 220b and beyond the axially-extending first section 224a, 224b at one end (the scaling end 210a, 210b) of the seal body 202a, 202b, and an angle between the seal face surface 208a, 208b of the second section 226a, 226b (which defines the second or sealing end 210a, 210b of the seal body 202a, 202b) and the inner circumference 216a, 216b of the seal body 202a, 202b is 90°, or proximate to 90° in a value range of between 90° to 110°.

Furthermore, the seal face surface 208a, 208b of the outer seal layer 208a, 208b, can be, or can include, a substantially flat surface, and for the purposes of the present disclosure, the "substantially flat surface" of the seal face surface 208a, 208b of the outer seal layer 208a, 208b means that at least an outer radial portion, or seal hand 230a, 230b, of the seal face surface 208a, 208b, which defines an outermost (with respect to the center axis 220a, 220b), radially extending circumferential surface of the outer seal layer 208a, 208b and the sealing end 210a, 210b of the seal body 202a, 202b, positioned directly adjacent to and including and/or defining the outer circumference 218a, 218b of the seal 200 (200a, 200b) is a surface which extends uniformly along a plane oriented orthogonally, or at a 90° angle with respect to the center axis 220a, 220b of the seal 200 (200a, 200b).

As discussed above and as further disclosed herein, the seal body 202a, 202b of the seal 200 (200a, 200b), as formed, includes a first portion which is defined as the outer seal layer 206a, 206b, and additionally includes a second or main seal body portion 204a, 204b. The first portion or outer seal layer 206a, 206b, and the layer of first material 212a, 212b of which the outer seal layer 206a, 206b is composed, is included in the seal body 202a, 202b such that the seal body 202a, 202b includes the layer of first material 212a, 212b as an outer layer of material which is at, and forms, the sealing end 210a, 210b of the seal 200 (200a, 200b), and the seal face surface 208a, 208b is defined and formed as the outer surface of the outer seal layer 206a, 206b, and the layer of first material 212a, 212b thereof, at the sealing end 210a, 210b of the seal 200 (200a, 200b). As such, the first portion or outer seal layer 206a, 206b, and the layer of first material 212a, 212b of which the outer seal layer 206a, 206b is composed, is positioned and fabricated as an integral, constituent portion of the seal 200 (200a, 200b) to form at least an outermost portion of the second section 226a, 226b of the annular seal body 202a, 202b proximate to, including, and forming the sealing end 210a, 210b of the seal 200 (200a, 200b) and the seal body 202a, 202b thereof. The outer seal layer 206a, 206b, and the layer of first material 212a, 212b thereof, can also include and/or can be formed as an integral portion of the annular seal body 202a, 202b having a thickness 232a, 232b extending axially from the seal face surface 208a, 208b which defines the sealing end 210a, 210b of the seal body 202a, 202b to an inner, terminal end 234a, 234b of the outer seal layer 206a, 206b. The thickness 232a, 232b of the layer of first material 212a, 212b may be defined by the one or more materials and/or substances and material composition of the layer of first material 212a, 212b, as further discussed herein. In one embodiment, the first portion or outer seal layer 206a, 206b, and the layer of first material 212a, 212b of which the outer seal layer 206a, 206b, is composed may include a thickness 232a, 232b of between 100 microns to 500 microns.

The second or main seal body portion 204a, 204b of the seal 200 (200a, 200b) thus can include, and can be defined as extending along and throughout, and forming the remainder of the seal body 202a, 202b from the first outer axial end 222a, 222b of the seal body 202a, 202b to the inner, terminal end 234a, 234b of the outer seal layer 206a, 206b opposite the sealing end 210a, 210b and seal face surface 208a, 208b thereof. As provided above, the second or main seal body portion 204a, 204b, which is composed of and formed from a second or main seal body material 214a, 214b, and as such, in one embodiment, upon formation of the outer seal layer 206a, 206b, the second or main seal body portion 204a, 204b can include and form the remaining portion and/or portions of the seal body 202a, 202b such that the first section 224a, 224b of the seal body 202a, 202b and a portion of the second section 226a, 226b extending from the first section 224a, 224b to the inner, terminal end 234a, 234b of the outer seal layer 206a, 206b opposite the sealing end 210a, 210b are composed of and formed from the second or main seal body material 214a, 214b of the main seal body portion 204a, 204b.

The first material 212a, 212b, of which the outer seal layer 206a, 206b (and seal face surface 208a, 208b) is formed, is composed of and/or includes one or more materials and/or substances such that the first material 212a, 212b includes a material composition having and/or exhibiting properties including, in part, at least one of, or one or more of, high hardness, high wear-resistance, a low coefficient of friction, low thermal diffusibility, and high strength, as further disclosed herein. In addition, the second or main seal body material 214a, 214b, of which the main seal body portion 204a, 204b is formed, is composed of and/or includes one or more materials and/or substances such that the main seal body material 214a, 214b includes a material composition having and/or exhibiting properties including, in part, at least one of, or one or more of, high compressive strength, toughness, hardness, manufactucturability, and low cost, as further disclosed herein.

It is to be understood that the terms "first", "second", and "material" as associated with the first material 212a, 212b of the outer seal layer 206a, 206b and the second or main seal body material 214a, 214b of the main seal body portion 204a, 204b are not meant to be construed or interpreted as limiting either the outer seal layer 206a, 206b or the main seal body portion 204a, 204b, or both, as consisting solely of a single material. Instead, such terms are used for the purposes of the present disclosure solely in order to differentiate and designate the outer seal layer 206a, 206b as being formed from and/or including at least one, or one or more, material(s), substance(s), composition(s), and property(ies) which is (or are) different from that (or those) of the main seal body portion 204a, 204b. As such, the first material 212a, 212b of the outer seal layer 206a, 206b and the second or main seal body material 214a, 214b of the main seal body portion 204a, 204b are meant to encompass and include any one or more, or any combination of material(s), substance(s), composition(s), and the like which may form the outer seal layer 206a, 206b, and the main seal body portion 204a, 204b, respectively, according to any one or more embodiments as disclosed herein.

In addition to the one or more material compositions and/or properties as discussed above and further disclosed herein, the second or main seal body material 214a, 214b of the main seal body portion 204a, 204b, includes a material composition having and/or exhibiting properties which are conducive to the fabrication of the main seal body portion 204a, 204b as being formed to include internal features as illustrated in the embodiments of FIG. 3 and FIG. 4, namely, the channels 340 of seal 200 embodied as seal 200a as shown in the embodiment as illustrated in FIG. 3 and the channel 460 of seal 200 embodied as seal 200b as shown in the embodiment as illustrated in FIG. 4.

Referring to the embodiment illustrated in FIG. 3, the main seal body portion 204a of seal 200a includes a plurality of equally spaced channels 340 extending into the interior of the main seal body portion 204a of the seal body 202a positioned along and throughout the inner circumference 216a of the seal 200a. In particular, each pair of successive, adjacent channels 340 of the plurality of equally spaced channels 340 defines a solid fin 342 therebetween, composed of the main seal body material 214a, to thus define the inner circumference 216a of the seal 200a as including a plurality of successive, alternating, equally spaced fins 342 and equally spaced channels 340. In one embodiment, each of the plurality channels 340 can be identical in geometry, dimensions, and shape, and additionally, each of the plurality fins 342 can be identical in geometry, dimensions, and shape, and wherein each of the plurality tins 342 can. Each Channel 340 can be formed as a radially extending opening or slot 340' defined and/or bounded by one or more radially extending inner walls or surfaces extending from the inner circumference 216a of the seal body 202a into the main seal body portion 204a thereof and bounded laterally by successive, adjacent fins 342. In particular, each channel 340 can include a first inner surface 346 extending into the interior of the main seal body portion 204a of the seal body 202a from a first end 347 of the first inner surface 346 and a second inner surface 348 extending into the interior of the main seal body portion 204a of the seal body 202a from a first end 349 of the second inner surface 348, wherein the second ends of the first inner surface 346 and the second inner surface 348 intersect at a terminal, internal intersection end 350 to define the radial inner boundaries of each slot 340'.

The terminal, internal intersection end 350 at which the second or terminal ends of the first inner surface 346 and the second inner surface 348 meet can be positioned within the portion of the second section 226a within the main seal body portion 204a of the seal body 202a proximate to the inner, terminal end 234a of the outer seal layer 206a as well as the outer circumference 218a of the seal body 202a and further positioned proximate to and aligned with the seal band 230a of the seal face surface 208a. In particular, the first end 347 of the first inner surface 346 can be positioned along the inner circumference 216a of the first section 224a of the seal body 202a proximate to, or alternatively, at, the first outer axial end 222a of the seal body 202a, and the first inner surface 346 can extend radially and angularly into the interior of the main seal body portion 204a of the seal body 202a from the first end 347 of the first inner surface 346 toward the outer circumference 218a of the seal body 202a to intersect with the terminal, inner end of the second inner surface 348 at the terminal, internal intersection end 350.

The first end 349 of the second inner surface 348 can be positioned along the inner circumference 216a of an end of the main seal body portion 204a opposite the first outer axial end 222a of the seal body 202a and proximate to the inner, terminal end 234a of the outer seal layer 206a. In one embodiment, the first end 349 of the second inner surface 348 can be positioned along the inner circumference 216a of the portion of the second section 226a of the seal body 202a within the main seal body portion 204a of the seal body 202a. Alternatively, the first end 349 of the second inner surface 348 can be positioned along the inner circumference 216a of an end portion of the first section 224a opposite the first outer axial end 222a of the seal body 202a and proximate to the second section 226a of the seal body 202a, or alternatively, at, the first outer axial end 222a of the seal body 202a. The second inner surface 348 can extend radially and angularly into the interior of the main seal body portion 204a of the seal body 202a from the first end 349 of the second inner surface 348 toward the outer circumference 218a of the seal body 202a to intersect with the terminal, inner end of the first inner surface 346 at the terminal, internal intersection end 350.

In use, the seal 202a according to the embodiment illustrated in FIG. 3 may be incorporated into a mechanical system to form and maintain an outer sealing interface, and in certain applications, may form a rotatable, sealing engagement and interface (about the center axis 220a of the seal 200a) with an adjacent, facing component or surface thereof which the outer seal band 230a of the seal face surface 208a contacts proximate to the outer circumference 218a of the seal 200a, while the inner circumference 216a of the seal 200a may be at least partially submerged within or otherwise exposed to rotatably interact with and retain a lubricant fluid within an internal environment of the system. The mechanical, and in some applications, rotatable, mechanical sealing engagement between the adjacent, facing component or surface thereof which the outer seal band 230a of the seal face surface 208a contacts, and the frictional forces applied to and experienced by the seal face surface 208a as a result of such mechanical sealing contact, may result in the generation of heat within the seal face surface 208a, at, and proximate to the outer seal band 230a. In addition to forming and maintaining a sealing interface, the seal 202a, and the features thereof as disclosed herein, according to the embodiment illustrated in FIG. 3 may be further configured to cool and dissipate such heat which may be generated within the seal face surface 208a, at, and proximate to the outer seal band 230a. Specifically, the plurality of successive, alternating, equally spaced fins 342 and equally spaced channels 340 positioned along and throughout the inner circumference 216a of the seal 200a may cooperatively engage, retain, circulate, and mechanically and fluidly direct the lubricant fluid into each radially extending opening or slot 340' extending into the interior of the main seal body portion 204a of the seal body 202a as each channel 340 passes through or otherwise engages or comes into contact with the lubricant fluid such that the lubricant fluid is directed to the terminal, internal intersection end 350 of each slot 340' and in thermal proximity to the seal face surface 208a of the of the outer seal layer 206a (as well as the seal hand 230a thereof) to thermally engage and absorb the heat which may be generated within the seal face surface 208a, at, and proximate to the outer seal band 230a. Such thermal engagement may result in the transfer of heat from within the seal face surface 208a to the lubricant fluid which may thus effectuate cooling of the seal face surface 208a and the outer seal band 230a thereof.

Additionally, in embodiments wherein the seal 202a may form a rotatable, sealing engagement and interface (about the center axis 220a of the seal 200a) with an adjacent, facing component or surface thereof, each of the plurality of successive, alternating, equally spaced fins 342 and channels 340 positioned along and throughout the inner circumference 216a of the seal 200a may interact with and engage the lubricant fluid to "pump" or otherwise cooperatively, mechanically, and rotationally retain, circulate, and mechanically and fluidly direct the lubricant fluid to, along, and throughout the entirety of the circumference of the seal face surface 208a and the outer seal band 230a thereof as the seal 202a rotates about its center axis 220a.

Referring to seal 200 embodied as seal 200b as illustrated in FIG. 4, the main seal body portion 204b of seal 200b includes a continuous, internal channel 460 defined within and extending continuously throughout the circumference of the main seal body portion 204b of the seal body 202b. The internal channel 460, and an open interior 461 thereof, can be formed within the main seal body portion 204b and defined as following a consistent, repeatable, serpentine path which successively alternates to extend between each of a plurality of channel openings 462 defined within, and positioned at equally spaced intervals along, the inner circumference 216b of the main seal body portion 204b, and the outer circumference 218b of the seal body 202b proximate to the seal face surface 208a. In particular, the internal channel 460 can include and be defined by a plurality of identical, successive, interconnected, curvilinear or serpentine sections 464 which interconnect to form the continuous, internal channel 460 which extends along and throughout the radial circumference of the main seal body portion 204b of the seal body 202b. Given that each of the sections 464 which interconnect to form the continuous, internal channel 460 are identical, only one section 464' will be discussed for the purposes of the present disclosure.

Each section (depicted as exemplary section 464') of the plurality of sections 464 includes a first channel segment 466 and a second channel segment 468. The first channel segment 466 can include a first end 467 which connects to a first end of an immediately preceding, successive second channel segment (in a manner consistent with and identical to the first end 469 of the second channel segment 468) at a first channel opening 462' of the plurality of channel openings 462 formed within the inner circumference 216b of the main seal body portion 204b such that the first end 467 connects the interior 461 of the internal channel 460 in communication with the first channel opening 462' at the inner circumference 216b of the main seal body portion 204b. The second channel segment 468 can include a first end 469 which connects to a first end of an immediately following or subsequent successive first channel segment (in a manner consistent with and identical to the first end 467 of the first channel segment 466) at an adjacent, next, or immediately successive, evenly spaced second channel opening 462" of the plurality of channel openings 462 from and with respect to the first channel opening 462'. Similarly, the first end 469 of the second channel segment 468 connects the interior 461 of the internal channel 460 in communication with the second channel opening 462" at the inner circumference 216b of the main seal body portion 204b. The first channel segment 466 can extend radially and angularly from its first end 467 into the interior of the main seal body portion 204b of the seal body 202b toward the outer circumference 218b of the seal body 202b and additionally extends along a portion of the arc of the circumference of the seal body 202b toward the second channel segment 468, and the second channel segment 468 can extend radially and angularly from its first end 469 into the interior of the main seal body portion 204b of the seal body 202b toward the outer circumference 218b of the seal body 202b and additionally extends along a portion of the arc of the circumference of the seal body 202b toward the first channel segment 466 such that the second ends of the first channel segment 466 and the second channel segment 468 connect at an outer channel segment 470. The outer channel segment 470 can connect the first channel segment 466 in communication with the second channel segment 468 (and the portions of the interior 461 of the channel 460 defined thereby) and can be positioned between immediately successive, adjacent first and second channel openings 462', 462" within the portion of the second section 226b within the main seal body portion 204b of the seal body 202b proximate to the inner, terminal end 234b of the outer seal layer 206b as well as the outer circumference 218b of the seal body 202b and further positioned proximate to and aligned with the seal hand 230b of the seal face surface 208b.

The seal 202b, and the features thereof as disclosed herein according to the embodiment illustrated in FIG. 4 may be configured to cool and dissipate heat which may be generated within the seal face surface 208b, at, and proximate to the outer seal band 230b. Specifically, the plurality of channel openings 462 defined within, and positioned at equally spaced intervals along the inner circumference 216b of the main seal body portion 204b may direct lubricant fluid into the interior 461 of the channel 460 such that the lubricant fluid is fluidly communicated and circulated into and through the plurality of sections 464, 464' and directed through each outer channel segment 470 and in thermal proximity to the seal face surface 208b of the of the outer seal layer 206b (as well as the seal band 230b thereof) to thermally engage and absorb the heat which may be generated within the seal face surface 208b, at, and proximate to the outer seal hand 230b. Such thermal engagement may result in the transfer of heat from within the seal face surface 208b to the lubricant fluid which may thus effectuate cooling of the seal face surface 208b and the outer seal hand 230b thereof. Additionally, in embodiments wherein the seal 202b may form a rotatable, sealing engagement and interface (about the center axis 220b of the seal 200b) with an adjacent, facing component or surface thereof, the plurality of equally spaced channel openings 462 may fluidly interact with the sections 464, 464' of the channel 460 to engage the lubricant fluid to "pump" or otherwise cooperatively, mechanically, and rotationally and fluidly direct, communicate, and circulate the lubricant fluid from the inner circumference 216b of the seal body 202b, into and through the interior 461 of the channel 460, throughout the entirety of the circumference of the seal body 202b as the seal 202b rotates about its center axis 220b such that the lubricating fluid is directed to flow, in part, through each outer channel segment 470 and in thermal proximity to effectuate cooling of the seal face surface 208b of the of the outer seal layer 206b (as well as the seal band 230b thereof).

The seal 200 (200a, 200b) as well as the elements, features, and components thereof, can be manufactured via any or more of the processes and steps according to any one or more of the embodiments as disclosed herein. In particular, the seal 200 (200a, 200b), and the portions thereof, namely, the first portion or outer seal layer 206a, 206b, and the second or main seal body portion 204a, 204b can be manufactured and formed via two distinct author separate processes (as well as the one or more steps of each), as further disclosed herein. In one embodiment, the first portion or outer seal layer 206a, 206b of the seal body 202a, 202b of the seal 200 (200a, 200b) can be formed or manufactured by the one or more steps of a first process, and the second or main seal body portion 204a, 204b of the seal body 202a, 202b of the seal 200 (200a, 200b) can be formed by the one or more steps of a second process. In one embodiment, the first process, or at least a portion thereof, may precede the second process.

In particular, in one embodiment, the first process can include a metal additive manufacturing process, or a first metal additive manufacturing process, as well as the steps thereof as disclosed herein, to form the first portion or outer seal layer 206a, 206b of the seal body 202a, 202b of the seal 200 (200a, 200b), as well as to form the composition of the first material 212a, 212b of which the outer seal layer 206a, 206b is formed. The second process employed to manufacture or fabricate the main seal body portion 204a, 204b of seal 200 to include, in part, the internal features thereof which can include the channels 340 of seal 200 embodied as seal 200a as shown in the embodiment illustrated in FIG. 3 or those of the channel 460 of seal 200 embodied as seal 200b shown in the embodiment as illustrated in FIG. 4 as discussed above, can include a second metal additive manufacturing process. Alternatively, the second process may include a casting process.

In addition, and more specifically, to form the outer seal layer 206a, 206b of the seal 200 (200a, 200b), the first process, which can be defined as the first metal additive manufacturing process, can include both metal additive manufacturing process or steps as well as nitriding process or steps as discussed further herein, can be used to form the outer seal layer 206a, 206b as being formed of a nitrided or nitrogen infused metal layer. As such, the first material 212a, 212b, of which the outer seal layer 206a, 206b (and seal face surface 208a, 208b) is formed, in one embodiment, includes a metal which is suited to or otherwise capable of fabrication via a metal additive manufacturing process in addition to the infusion of nitrogen therein via an included nitriding process according to the steps of the first process as further discussed herein. In particular, in one embodiment, the first material 212a, 212b includes a nitrided metal wherein the metal includes nitrogen infused consistently throughout the entirety of the thickness 234a, 234b of the first material 212a, 212b which forms outer seal layer 206a, 206b according to the steps of the first process according to any one or more of the embodiments as disclosed further herein. In addition, the first material 212a, 212b of the outer seal layer 206a, 206b can include a material composition which is compatible with the second or main seal body material 214a, 214b of the main seal body portion 204a, 204b (and vice versa) such that the first material 212a, 212b is completely, compatibly, and/or integrally or otherwise inseparably bonded with the main seal body material 214a, 214b during fabrication and in use (including, at least in part, along the interface between the inner, terminal end 234a, 234b of the outer seal layer 206a, 206b and the main seal body portion 204a, 204b) to form the seal 200 (200a, 200b) as including the outer seal layer 206a, 206b and main seal body portion 204a, 204b as an integrally formed, solid, unitary, and annular seal body 202a, 202b. Thus, the first material 212a, 212b includes a metal which is suited to or otherwise capable of fabrication via a first process which includes a metal additive manufacturing process or steps in addition to an included nitriding process or steps such that the first material 212a, 212b is not only formed as a nitrided metal, but also is formed as a nitrided metal outer seal layer 206a, 206b which is compatible with and forms a complete, integral bond with the second or main seal body material 214a, 214b of the main seal body portion 204a, 204b, which includes, in one embodiment, a metal which correspondingly forms a complete, integral bond with the nitrided metal first material 212a, 212b of the outer seal layer 206a, 206b.

In one embodiment, the outer seal layer 206a, 206b (and seal face surface 208a, 208b) is formed of and includes titanium which is subjected to one or more nitriding steps to infuse nitrogen consistently throughout the entirety of the thickness 234a, 234b thereof such that the first material 212a, 212b which forms the outer seal layer 206a, 206b (and seal face surface 208a, 208b) is titanium nitride (TiN), which includes a material composition having and/or exhibits properties including, in part, at least one of, or one or more of, high hardness, high wear-resistance, a low coefficient of friction, low thermal diffusibility, and high strength. Additionally, the second or main seal body material 214a, 214b of the main seal body portion 204a, 204b, which includes, a metal (or metal alloy) which correspondingly forms a complete, integral bond with the titanium nitride (TiN) first material 212a, 212b of the outer seal layer 206a, 206b. In one embodiment, the second or main seal body material 214a, 214b of the main seal body portion 204a, 204b can include and be formed of titanium, or alternatively, a titanium alloy, which forms a complete, integral bond with the titanium nitride (TiN) first material 212a, 212b of the outer seal layer 206a, 206b, exhibits properties including, in part, at least one of, or one or more of, high compressive strength, toughness, and hardness, and further is suited to, compatible with, or is otherwise capable of being employed to form the main seal body portion 204a, 204b of seal 200 as including, in part, the internal features thereof which can include the channels 340 of seal 200 embodied as seal 200a and the channel 460 of seal 200 embodied as seal 200b as illustrated in FIG. 3 and FIG. 4, respectively, via the second process, which can be defined as a second metal additive manufacturing process. Notwithstanding, it should be understood that the foregoing disclosure is meant to constitute only one exemplary embodiment of the present disclosure, as any one or more other materials, metals, and/or metal alloys can be employed and included to form the first material 212a, 212b and/or the second or main seal body material 214a, 214b which be suitable to meet any one or more of the characteristics or properties as disclosed herein. Furthermore, any and all of such other materials, metals, and/or metal alloys shall be included as falling within the scope of the present disclosure, as the benefit of the disclosure, knowledge, and teaching of the present disclosure is required for the appropriate selection of such other suitable materials, metals, and/or metal alloys.

INDUSTRIAL APPLICABILITY

The seal 200 according to any one or more of the embodiments as disclosed herein may be incorporated and utilized in any of a variety of systems, environments, and/or applications to sealingly engage another component, which may be a mechanical system component and/or another seal. In particular, and in addition to further advantages, the seal 200, which may be manufactured via any one or more of the methods as disclosed herein, may include an outer seal layer and a seal face surface thereof which may be fabricated to include a more complete, consistent, and/or greater composition of a hardness and/or wear resistance imparting element therein. In addition, the seal 200 according to any one or more of the embodiments as disclosed herein may include internal features which may more effectively cool and dissipate heat which may be generated in connection with the sealing engagement between the seal face surface of the seal 200 and an adjacent, facing component or surface thereof. Furthermore, the seal 200 may be fabricated via one or more processes and/or materials as discussed herein such that the body which may form the seal may include layers which may be completely, compatibly, and/or integrally or otherwise inseparably bonded.

Figure 5:
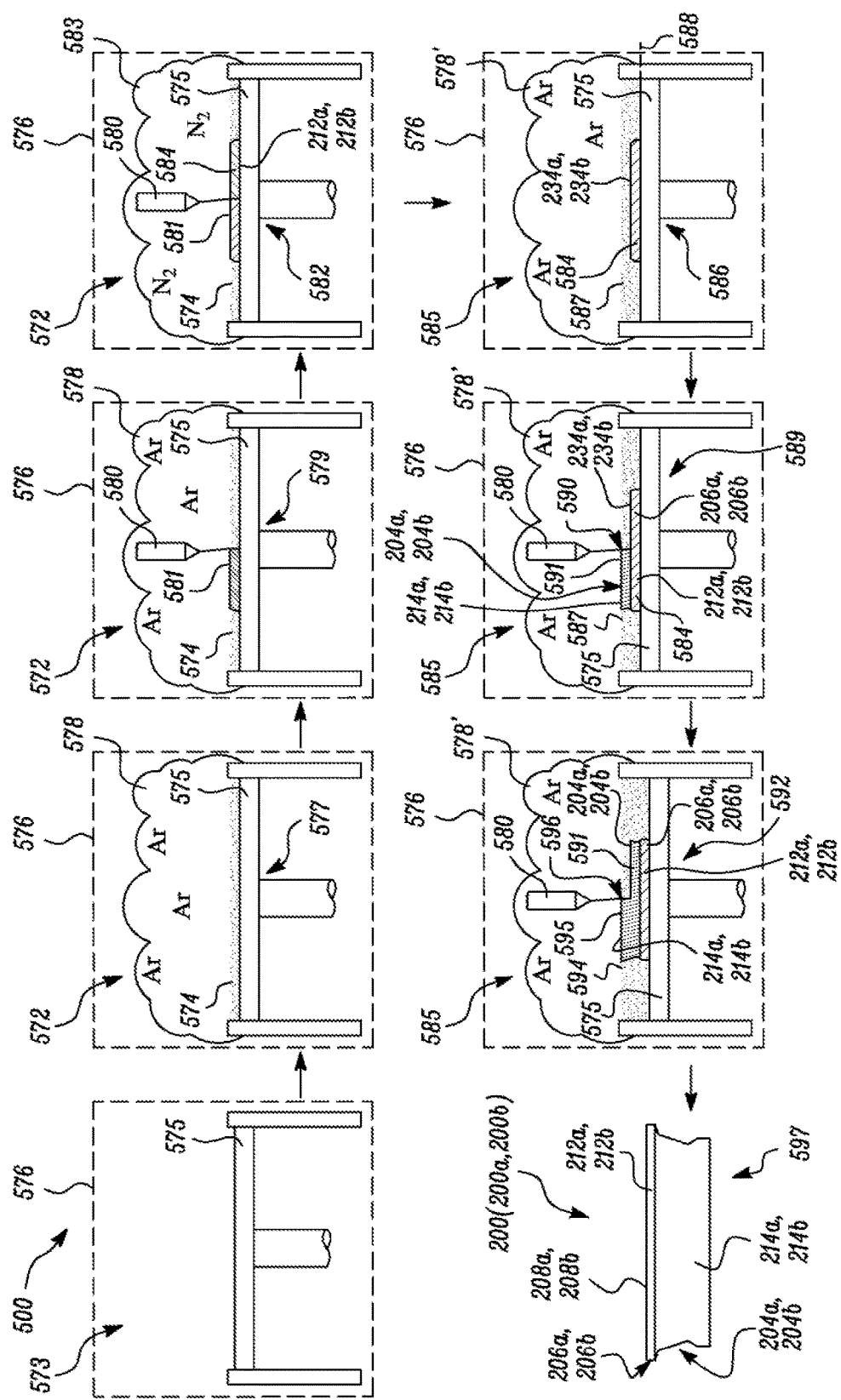
FIG. 5 is a process flow diagram illustrating a process of manufacturing the seal, in accordance with the concepts of the present disclosure.

FIG. 5 illustrates a process flow diagram 500 depicting one embodiment of a method and process for manufacturing the seal 200 (200a, 200b) according to any one or more of the embodiments as disclosed herein. In particular, FIG. 5, and the process flow diagram 500 illustrated therein, depicts a first process 572, as including steps 577, 579, and 582 which can include, in part, a first metallic additive manufacturing process, utilized to form the outer seal layer 206a, 206b of the seal 200 (200a, 200b) as being formed of the first material 212a, 212b, and additionally depicts the steps of a second process 585, which can be defined as and/or include a second metallic additive manufacturing process, utilized to form the or main seal body portion 204a, 204b of the seal 200 (200a, 200b) as being formed of the main seal body material 214a, 214b. FIG. 5, and the process flow diagram 500 illustrated therein, depicts the first process 572 and the second process 585 as utilizing, in part, metallic additive manufacturing processes each embodied as powder bed fusion process. However, it is to be understood that the process embodied in FIG. 5 and discussed herein is not meant to be limiting, as one or more other metallic additive manufacturing processes and/or other process types (or a combination thereof) may be used to form the seal 200 (200a, 200b).

Referring to FIG. 5, the method and process for manufacturing the seal 200 (200a, 200b) begins at step 573 with the placement of a metal base plate 575 within a closed chamber 576 in order to maintain a specified, controlled atmosphere therein during each of the steps of the formation of the seal 200 (200a, 200b) as discussed below. Referring to FIG. 5 (and with continued reference to FIG. 3 and FIG. 4), the first process 572 begins at step 577 with the deposition of a layer of powdered metal 574 upon the metal base plate 575 within the closed chamber 576 while maintaining an inert gas atmosphere 578. In one embodiment, the inert gas atmosphere 578 can be an atmosphere comprising Argon (Ar) which is maintained within the closed chamber 576 during the deposition of the layer of powdered metal 574 upon the metal base plate 575. It is to be understood, however, that the scope of the disclosure is not limited to maintaining the atmosphere of Argon as the inert gas atmosphere 578, as any other suitable inert gas may be used. As such, the inert gas atmosphere 578 maintained in the closed chamber 576 can include, but is not limited to, an Argon gas atmosphere, both for the present step as well as the remaining steps discussed herein within which an during which the inert gas atmosphere 578 is maintained. The metal base plate 575 may be defined as a metal substrate upon which the 3D printed seal 200 (200a, 200b) (and, more specifically, in the present embodiment, the outer seal layer 206a, 206b (including the seal face surface 208a, 208b thereof)) is formed. In one embodiment, the layer of powdered metal 574 is powdered titanium and the metal base plate 575 is formed, in whole or in part, from titanium. Following the deposition of the layer of powdered metal 574 as discussed above, the first process 572 progresses to step 579, which may be defined as a sintering step or process, during which a laser 580 applies heat to the deposited layer of powdered metal 574 within the inert gas atmosphere 578 to melt the layer of powdered metal 574 to form a formed, hardened metal layer 581 upon the cooling and solidification of the layer of powdered metal 574 melted via the laser 580. The layer of powdered metal 574 is deposited to a predetermined thickness in step 577 such that the formed, hardened metal layer 581 is formed to a corresponding predetermined thickness in step 579. The corresponding predetermined thickness of formed, hardened metal layer 581 can be based upon a variety of factors, which can include, in part, factors attendant to the structural composition and consistency of the formed, hardened metal layer 581, as well as the infusion and/or diffusibility of nitrogen within and throughout the thickness of the hardened metal layer 581, as further discussed herein. To provide one non-limiting example, in one embodiment, the layer of powdered metal 574 is deposited to a predetermined thickness in step 577 such that the formed, hardened metal layer 581 is formed to a corresponding predetermined thickness of between 1-3 millimeters in step 579.

The first process 572 then progresses to step 582, which begins with the formation of a nitrogen ($N_2$) atmosphere 583 within the within the closed chamber 576. In one embodiment, the formation of a nitrogen ($N_2$) atmosphere 583 within the closed chamber 576 may include mortification of the inert gas atmosphere 578 to include nitrogen ($N_2$). Alternatively, all, or a part of the inert gas (e.g., Argon) may be removed or purged from the closed chamber 576 prior to the introduction of nitrogen ($N_2$) therein and the formation of the nitrogen ($N_2$) atmosphere 583. Upon the formation of the nitrogen ($N_2$) atmosphere 583 within the closed chamber 576, step 582 progresses with the performance of at least one melting cycle during which heat from the laser 580 is applied (or re-applied) to, and in one embodiment, throughout the length of, the metal layer 581 within the nitrogen ($N_2$) atmosphere 583. In particular, as the laser 580 melts (or re-melts) the metal of the metal layer 581, the nitrogen from the nitrogen ($N_2$) atmosphere 583 is exposed to, interacts with, and is incorporated into the melted metal of the metal layer 581 such that the nitrogen diffuses into the metal matrix of the metal layer 581 such that the entirety, or at least a portion of, the metal layer 581 includes and/or is formed (or re-formed) as a layer of metal nitride 584 (also referred to herein as "metal nitride layer 584"), which, in one embodiment, is titanium nitride (TiN), which comprises and/or forms the first material 212a, 212b of the outer seal layer 206a, 206b. In one embodiment, the laser 580 may melts (or re-melt) the metal of the metal layer 581 such that nitrogen is infused consistently throughout the entirety of the length and thickness or depth of the metal layer 581 such that entirety of the metal layer 581 includes and/or is formed (or re-formed) as a layer of metal nitride 584. In particular, in one embodiment, step 582 can include the performance of multiple melting cycles such that the laser 580 melts (e.g., re-melts) the metal layer 581 a predetermined number of times, such as, for example, two or more, or three or more times, wherein each melting cycle may progressively increase the amount and/or concentration of nitrogen within the layer of metal nitride 584, the depth of penetration of nitrogen into the thickness of the layer of metal nitride 584, as well as the resultant hardness of the outer seal layer 206a, 206b, and the first material 212a, 212b thereof. In one embodiment, step 582 may include the performance of four or more, (e.g., 10-15) melting cycles to infuse the nitrogen into, and throughout the thickness of, the metal layer 581 and form the first material 212a, 212b as a layer of metal nitride 584 including a consistent amount and/or concentration of nitrogen throughout the entirety of the thickness or depth of the metal layer 581. In an alternate embodiment, only certain portions of the metal layer 581 may be melted to form the layer of metal nitride 584 at certain portions of the resultant outer seal layer 206, 206a. For example, in an alternate embodiment, the metal layer 581 may be melted to form a metal nitride layer 548 portion only along and throughout the thickness of the portion of the metal layer 581 which corresponds to, and forms the seal hand 230a, 230b of the seal 200 (200a, 200b). In yet another alternative embodiment, a greater number of melting cycles may be applied to certain portions of the metal layer 581 than others to infuse a higher concentration of nitrogen in such areas which may require a greater hardness and/or wear resistance. In particular, in one embodiment, step 582 may include the performance of a predetermined first number of one or more melting cycles to form a layer of metal nitride 584 having a first concentration of nitrogen throughout the entirety of the metal layer 581, and then perform a predetermined second number of one or more additional melting cycles to certain portions of the metal layer 581 which may require a greater hardness and/or wear resistance (e.g., along and throughout the thickness of the portion of the metal layer 581 which corresponds to, and forms the seal band 230*a*, 230*b* of the seal 200 (200*a*, 200*b*)) to form such portions as a layer of metal nitride 584 having a second concentration of nitrogen, wherein the second concentration of nitrogen is greater than the first concentration of nitrogen.

It is to be understood that the outer seal layer 206*a*, 206*b*, and the first material 212*a*, 212*b* thereof, may be formed by a plurality of layers of metal nitride 584 deposited and formed via an additive manufacturing process such as that included in and according to the first process 572 as disclosed herein. As such, while a single iteration or performance of the first process 572 which includes steps 577, 579, and 582 has been disclosed for the purposes of providing an illustrative, exemplary disclosure of the process by which the outer seal layer 206*a*, 206*b* is formed, it is to be understood that one or more iterations or performances of the first process 572 may be performed to result in the formation of the resultant layer of metal nitride 584 having a thickness equivalent to the thickness 232*a*, 232*b* of the outer seal layer 206*a*, 206*b* to thus form the entirety of the outer seal layer 206*a*, 206*b*, and the first material 212*a*, 212*b* thereof. In particular, depending upon the intended thickness 232*a*, 232*b* of the outer seal layer 206*a*, 206*b*, the performance of steps 577, 579, and 582 may be repeated in a manner identical as described above, except that instead of depositing a layer of powdered metal 574 upon the metal base plate 575 as described in step 577 above, any one or more subsequent iterations of steps 577, 579, and 582 may involve a modification to step 577 which may include a lowering of the metal base plate 575 and the deposition of an additional layer of powdered metal 574 upon the upper or top outer surface of the layer of metal nitride 584 formed via a preceding performance of steps 577, 579, and 582 until the overall thickness of the resultant layer of metal nitride 584 has a thickness equivalent to the desired thickness 232*a*, 232*b* of the outer seal layer 206*a*, 206*b*.

Referring to FIG. 5 (and with continued reference to FIG. 3 and FIG. 4), the first process 572 thus can conclude with step 582 to result in the completed formation of the layer of metal nitride 584 as forming and/or defining the dimensions and features of the outer seal layer 206*a*, 206*b* as well as the composition of the first material 212*a*, 212*b*, wherein the interface between the layer of metal nitride 584 and the upper or outer surface of the metal base plate 575 (upon removal of the formed seal 200 (200*a*, 200*b*) from the metal base plate 575) can define and/or form the seal face surface 208*a*, 208*b*, which can include the outer seal band 230*a*, 230*b*, and the sealing end 210*a*, 210*b* of the seal 200 (200*a*, 200*b*), and the upper or top outer surface of the layer of metal nitride 584 can define and/or form the inner, terminal end 234*a*, 234*b* of the seal face surface 208*a*, 208*b*.

Still referring to FIG. 5, the process flow diagram 500 further depicts the steps of the second process 585, which can be performed to fabricate the main seal body portion 204*a*, 204*b* of the seal 200 (200*a*, 200*b*) as being formed of the main seal body material 214*a*, 214*b*. As provided above, the second process 585 can be employed to manufacture or fabricate the entirety of the main seal body portion 204*a*, 204*b* of seal 200 to include, in part, the internal features thereof which can include the channels 340 of seal 200 embodied as seal 200*a* as shown in the embodiment illustrated in FIG. 3 or those of the channel 460 of seal 200 embodied as seal 200*b* shown in the embodiment as illustrated in FIG. 4. In one embodiment, a three-dimensional model of the seal 200*a* as shown in the embodiment illustrated in FIG. 3 and a three-dimensional model of the seal 200*b* shown in the embodiment as illustrated in FIG. 4 may be stored in the memory of, electronically transmitted to, referenced by, or otherwise used by a controller (not shown). The controller may be electronically and controllably connected to the laser 580 to actuate and control the operation of the laser 580 based upon the applicable three-dimensional model to form the main seal body portion 204*a*, 204*b* of the seal 200 (200*a*, 200*b*) according to the second process 585 as disclosed herein, as well as, in one embodiment, additionally, to form the outer seal layer 206*a*, 206*b* of the seal 200 (200*a*, 200*b*) according to the first process 572 as discussed above. It should be understood that the process flow diagram 500 as shown in FIG. 5 is meant to provide an exemplary, schematic depiction of a method and process for manufacturing the seal 200 (200*a*, 200*b*) which is equally applicable to seal 200 embodied as seal 200*a* as shown in the embodiment illustrated in FIG. 3 as well as seal 200 embodied as seal 200*b* shown in the embodiment as illustrated in FIG. 4. As such, for the purposes of the discussion of the method and process for manufacturing the seal 200 (200*a*, 200*b*) in connection with the process flow diagram 500 as shown in FIG. 5, the use and designation of the reference characters "a" and "b" designating the seal 200*a* of FIG. 3 and seal 200*b* of FIG. 4, and the elements thereof, respectively, shall be interpreted or construed to mean that the method and process for manufacturing the seal 200 (200*a*, 200*b*) according to the first process 572 as disclosed above as well as the second process 585 as disclosed below shall be applicable to either of seal 200*a* or seal 200*b*.

In particular, further referring to FIG. 5, the second process 585 begins with step 586 includes the formation (or re-formation) of the inert gas atmosphere 578' within the closed chamber 576 which can be preceded by the removal or purging of the remaining nitrogen ($N_2$) from the closed chamber 576 which may remain therein at the end of the final step 582 of the first process 572. Step 586 also includes the lowering of the metal base plate 575 to a position 588 which is lower than, or below the position occupied during the first process 572, and steps 577, 579, and 582 thereof and further below the upper or top outer surface of the layer of metal nitride 584 which can define and/or form the inner, terminal end 234*a*, 234*b* of the seal face surface 208*a*, 208*b* formed via the first process 572. Upon the lowering of the metal base plate 575 to position 588, step 586 of the second process 585 progresses with the deposition of a first layer of powdered metal 587 which forms the second or main seal body material 214*a*, 214*b* of the main seal body portion 204*a*, 204*b* upon the upper or top outer surface of the layer of metal nitride 584 which can be defined as the inner, terminal end 234*a*, 234*b* of the seal face surface 208*a*, 208*b*. As provided above, the (first, next or second) layers of powdered metal 587, 594, as well as the (first, next or second) metal layers 591, 595, can be composed of titanium. In one non-limiting embodiment, each of the (first, next or second) layers of powdered metal 587, 594 is powdered titanium alloy, and form the (first, next or second) metal layers 591, 595 as titanium alloy layers, as disclosed herein. In another non-limiting embodiment, each of the (first, next or second) layers of powdered metal 587, 594 is powdered titanium, and form the (first, next or second) metal layers 591, 595 as titanium layers as disclosed herein. However, it should be understood that the each of the (first, next or second) layers of powdered metal 587, 594, as well as the (first, next or second) metal layers 591, 595 which compose the second or main seal body material 214a, 214b and form the main seal body portion 204a, 204b can be composed of other powdered and formed metals, or other powdered and formed metal alloys.

Following the deposition of the first layer of powdered metal 587 as discussed above, the second process 585 progresses to step 589, which may be defined as a sintering step or process, during which a laser 580 applies heat to the deposited first layer of powdered metal 587 within the inert gas atmosphere 578' at predetermined locations 590 to melt and fuse the first layer of powdered metal 587 to form a hardened, first metal layer 591 which not only comprises and/or forms the second or main seal body material 214a, 214b, but also fuses the first metal layer 591 to the upper or top outer surface of the layer of metal nitride 584 which corresponds to the inner, terminal end 234a, 234b of the seal face surface 208a, 208b and defines an interface between the outer seal layer 206a, 206b and the second or main seal body portion 204a, 204b of the seal body 202a, 202b of the seal 200 (200a, 200b). As such, the first metal layer 591 can form a portion of the main seal body portion 204a, 204b and the second or main seal body material 214a, 214b thereof, which is completely, compatibly, and/or integrally or otherwise inseparably bonded and fused with the layer of metal nitride 584 which defines and forms the first material 212a, 212b and the seal face surface 208a, 208b. In one embodiment, the first metal layer 591 may form the portion of the second section 226a, 226b within the main seal body portion 204a, 204b of the seal body 202a, 202b proximate to the inner, terminal end 234a, 234b of the outer seal layer 206a, 206b.

Still referring to FIG. 5, the second process 585 progresses to step 592, during which the metal base plate 575 is lowered to a next position 593 which is lower than, or below the position occupied, and the first metal layer 591 formed, during step 589, and thereafter a next or second layer of powdered metal 594 is deposited upon the first metal layer 591 formed during step 589 within the inert gas atmosphere 578' of the closed chamber 576. Thereafter, step 592 progresses with the laser 580 applying heat to the deposited next or second layer of powdered metal 594 within the inert gas atmosphere 578' at predetermined locations 596 to melt and fuse the second layer of powdered metal 594 to form a hardened, next or second metal layer 595 and integrally fuse the next or second metal layer 595 to the upper or top outer surface of the first metal layer 591 and form next or second portion of the main seal body portion 204a, 204b extending axially outward from the first metal layer 591.

The predetermined locations 590, 596 at which the laser 580 to applies heat to the first and next or second layer of powdered metal 591, 594 may be based upon and/or correspond to one or more parameters, such as the coordinates, structure, and the dimensions of the three-dimensional model of the seal 200 (200a, 200b) such that the first metal layer 591 and the next or second metal layer 595 conform to, and form the seal 200 (200a, 200b) (or portions thereof) based upon and according to, the three-dimensional model of the seal 200 (200a, 200b). In particular, and as discussed above, the three-dimensional model of the seal 200a shown in the embodiment illustrated in FIG. 3 and the three-dimensional model of the seal 200b shown in the embodiment as illustrated in FIG. 4 may include parameters, instructions, or other data descriptive of, indicative of, or characterizing the size, shape, structure, dimensions, orientations, locations, and/or features of the main seal body portion 204a, 204b of seal 200 (200a, 200b), including, in part, the internal features thereof which can include the channels 340 of seal 200 embodied as seal 200a as shown in the embodiment illustrated in FIG. 3 and those of the channel 460 of seal 200 embodied as seal 200b shown in the embodiment as illustrated in FIG. 4. The controller may reference, receive, or otherwise utilize, and may further process such parameters, instructions, or data and, in response, may actuate the laser 580 to apply heat to the first and next or second layer of powdered metal 591, 594 at the predetermined locations 590, 596, as discussed above in connection with steps 589 and 592, respectively, wherein the predetermined locations 590, 596 may correspond to the size, shape, structure, dimensions, orientations, locations, and/or features of the main seal body portion 204a, 204b of seal 200 (200a, 200b) of the three-dimensional model of the seal 200 (200a, 200b). As such, the resultant first metal layer 591 and the next or second metal layer 595 (as well as, in one embodiment, subsequent next or second metal layers 595) conform to the size, shape, structure, dimensions, orientations, locations, and/or features of the main seal body portion 204a, 204b of the seal 200 (200a, 200b) which may be based upon and according to, the three-dimensional model of the seal 200 (200a, 200b) to progressively, collectively, and ultimately form the entirety of the main seal body portion 204a, 204b of the as-formed seal 200 (200a, 200b) as including in part, the internal features thereof which can include the channels 340 of seal 200 embodied as seal 200a as shown in the embodiment illustrated in FIG. 3 or those of the channel 460 of seal 200 embodied as seal 200b shown in the embodiment as illustrated in FIG. 4.

It is to be understood that the main seal body portion 204a, 204b, and the main seal body material 214a, 214b thereof, may be formed by a plurality of first, next or second, (and any subsequent) metal layers 591, 595 deposited and formed via an additive manufacturing process such as that included in and according to the second process 585 as disclosed herein. Thus, and as indicated above, step 592 may be repeated in a manner consistent with the foregoing discussion as necessary to form one or more additional, subsequent hardened, next or second main seal body material 214a, 214b metal layers consistent with next or second metal layer 595 as discussed above to progressively form next or second portions of the main seal body portion 204a, 204b, and the main seal body material 214a, 214b thereof, extending axially outward from the previously formed first and/or second metal layer 591, 595 until the entirety of the main seal body portion 204a, 204b is formed. Thereafter, the formed seal 200 (200a, 200b), including the outer seal layer 206a, 206b formed via the first process 572 and the main seal body portion 204a, 204b formed (and integrally and/or inseparably bonded or fused to the outer seal layer 206a, 206) via the second process 585, the formed seal 200 (200a, 200b) is removed from the metal base plate 575 via any suitable removal process (e.g., via an EDM method) to provide the completed, formed seal 200 (200a, 200b) as shown in FIG. 5 at step 597.

It will be apparent to those skilled in the art that various modifications and variations can be made to the system of the present disclosure without departing from the scope of the disclosure. Other embodiments will be apparent to those skilled in the art from consideration of the specification and practice of the system disclosed herein. It is intended that the specification and examples be considered as exemplary only, with a true scope of the disclosure being indicated by the following claims and their equivalent.

What is claimed is:

1. A method for manufacturing a seal, the method comprising:
   forming a layer of a hardened metal layer on a metal base plate;
   melting the layer of the hardened metal layer in a nitrogen atmosphere to form a layer of metal nitride;
   depositing a plurality of layers of a metal alloy on the layer of metal nitride to form a main seal body portion, wherein the layer of metal nitride and the main seal body portion together correspond to the seal; and
   separating the seal from the metal base plate such that the layer of the metal nitride forms an outer seal layer of the seal.

2. The method of claim 1, wherein the metal is titanium.

3. The method of claim 1, wherein melting the layer of the hardened metal layer is performed by using a Laser.

4. The method of claim 1, wherein the main seal body portion, formed by depositing the plurality of layers of the metal alloy, includes an outer circumference and an inner circumference.

5. The method of claim 4, wherein the plurality of layers of the metal alloy is deposited in such a manner that one or more channels are defined in the main seal body portion, each of the one or more channels having an opening defined on the inner circumference of the main seal body portion.

6. The method of claim 1, wherein a thickness of the layer of metal nitride varies in a range of 100 microns to 500 microns.

7. A seal formed by a process comprising:
   forming a layer of a hardened titanium layer on a metal base plate;
   melting the layer of the hardened titanium layer in a nitrogen atmosphere to form a layer of titanium nitride;
   depositing a plurality of layers of a titanium alloy on the layer of titanium nitride to form a main seal body portion, wherein the layer of titanium nitride and the main seal body portion together correspond to the seal; and
   separating the seal from the metal base plate such that the layer of the titanium nitride forms an outer seal layer of the seal.

8. The seal of claim 7, wherein the layer of titanium is heated using a Laser.

9. The seal of claim 7, wherein thickness of the layer of titanium nitride varies in a range from 100 microns to 500 microns.

10. The seal of claim 7, wherein the main seal body portion, formed by depositing the plurality of layers of the titanium alloy, includes an outer circumference and an inner circumference.

11. The seal of claim 10, wherein the plurality of layers of the titanium alloy is deposited in such a manner that one or more channels are defined in the main seal body portion, each of the one or more channels having an opening defined on the inner circumference of the main seal body portion.

* * * * *